(12) United States Patent
Tsai et al.

(10) Patent No.: US 6,911,604 B2
(45) Date of Patent: Jun. 28, 2005

(54) BONDING PADS OF PRINTED CIRCUIT BOARD CAPABLE OF HOLDING SOLDER BALLS SECURELY

(75) Inventors: Chung-Che Tsai, Hsin Chu (TW); Wei-Heng Shan, Hsin Chu (TW)

(73) Assignee: Ultratera Corporation, Hsinchu (TW)

( * ) Notice: Subject to any disclaimer, the term of this patent is extended or adjusted under 35 U.S.C. 154(b) by 33 days.

(21) Appl. No.: 10/210,091

(22) Filed: Aug. 2, 2002

(65) Prior Publication Data

US 2004/0020688 A1 Feb. 5, 2004

(51) Int. Cl.⁷ .................................................. H05K 1/03
(52) U.S. Cl. ..................... 174/255; 174/261; 174/52.1; 361/767
(58) Field of Search ................................. 174/262–266, 174/250, 255, 261, 52.1; 361/748–751, 792–795, 767–771, 783

(56) References Cited

U.S. PATENT DOCUMENTS 5,889,655 A * 3/1999 Barrow ........................ 361/760
6,376,279 B1 * 4/2002 Kwon et al. ................. 438/113
6,472,608 B2 * 10/2002 Nakayama ................... 174/255
6,507,082 B2 * 1/2003 Thomas ....................... 257/414
6,700,204 B2 * 3/2004 Huang et al. ................. 257/774

* cited by examiner

Primary Examiner—Randy W. Gibson
Assistant Examiner—Jeremy Norris
(74) Attorney, Agent, or Firm—Browdy and Neimark, P.L.L.C.

(57) ABSTRACT

A printed circuit board, which comprises a substrate, a conductive pattern disposed on a surface of said substrate and a solder mask coated on the surface of said substrate and covered over the conductive pattern. The conductive pattern has a bonding pad. The solder mask has an opening corresponding in location to the bonding pad such that a portion of the bonding pad is exposed outside. A space is left between said solder mask and said bonding pad and is communicated with the opening. Whereby, a solder ball can be received in the opening and the space and electrically connected to the bonding pad, such that the solder ball is held on the printed circuit board securely.

7 Claims, 2 Drawing Sheets

BONDING PADS OF PRINTED CIRCUIT BOARD CAPABLE OF HOLDING SOLDER BALLS SECURELY

FIELD OF THE INVENTION

The present invention relates generally to a printed circuit board (PCB), and more particularly to a bonding pad structure of the printed circuit board, which is capable of holding a solder ball securely on the bonding pad.

BACKGROUND OF THE INVENTION

Please refer to FIG. 1, a conventional printed circuit board (PCB) which can be served as an integrated circuit (IC) chip carrier, typically has a substrate 90. The substrate 90 has a top surface and a bottom surface wherein either surface, or both surfaces, has a conductive layout pattern and a solder mask 92 which is coated on the surface of the substrate 90 and covered over the conductive pattern. The conductive pattern usually has bonding pads 94 for electrically coupling the PCB to such devices as electronic elements, e.g. chips, and electronic carriers, e.g. mother circuit board, by means of solder balls or bonding wires. The solder mask 92 provides at predetermined positions thereof with a plurality of openings 922 corresponding in locations to the bonding pads 94 such that the bonding pads 94 can be exposed outside. The openings 922 are formed by etching the solder mask 92, and they usually have larger dimensions at top ends thereof and smaller dimensions at bottom ends thereof. As shown in FIG. 1, each of the openings 922 can receive a solder ball 96 therein. The solder ball 96 is soldered on the bonding pad 94 of the conductive pattern by means of reflowing treatment. The solder ball 96 has a bump portion 962 extruded out of the opening 922 for coupling the PCB to a predetermined device. The solder ball 96 has the other portions which are connected to the solder mask 92 and the bonding pad 94 at the regions labeled 97, 98 and 99.

It is obvious to understand that the solder ball 96 has a weak capacity to be secured in the opening 922, because of the solder ball 96 is mainly contacted with the solder mask 92 at the regions labeled 97 and 98. However, the solder mask 92 is made of resin material such as epoxy resin, which has a weak interface-connected strength to bond the metallic solder ball 96. So, the solder balls 96 are easy to loose from the openings 922 while an unexpectable force exerted onto the solder balls 96.

SUMMARY OF THE INVENTION

The primary objective of the present invention is to provide a printed circuit board, which has a capacity of holding solder balls fixedly.

In order to achieve the aforesaid objective, the present invention is to provide a printed circuit board, which comprises a substrate, a conductive pattern disposed on a surface of said substrate and a solder mask coated on the surface of said substrate and covered over the conductive pattern. The conductive pattern has a bonding pad. The solder mask has an opening corresponding in location to the bonding pad such that a portion of the bonding pad is exposed outside. A space is left between said solder mask and said bonding pad and is communicated with the opening. Whereby, a solder ball can be received in the opening and the space and electrically connected to the bonding pad, such that the solder ball is held on the printed circuit board securely.

DETAIL DESCRIPTION OF THE PRESENT INVENTION

Figure 1:
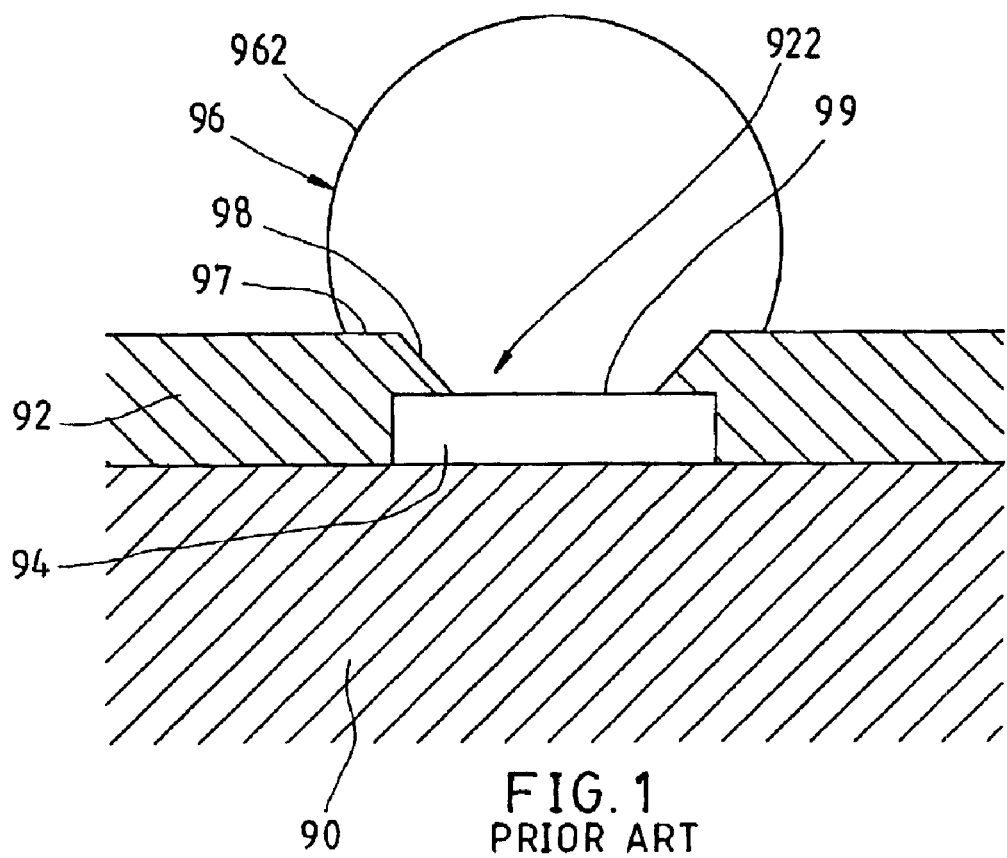
FIG. 1 is a sectional view of a portion of a conventional printed circuit board.
Figure 2:
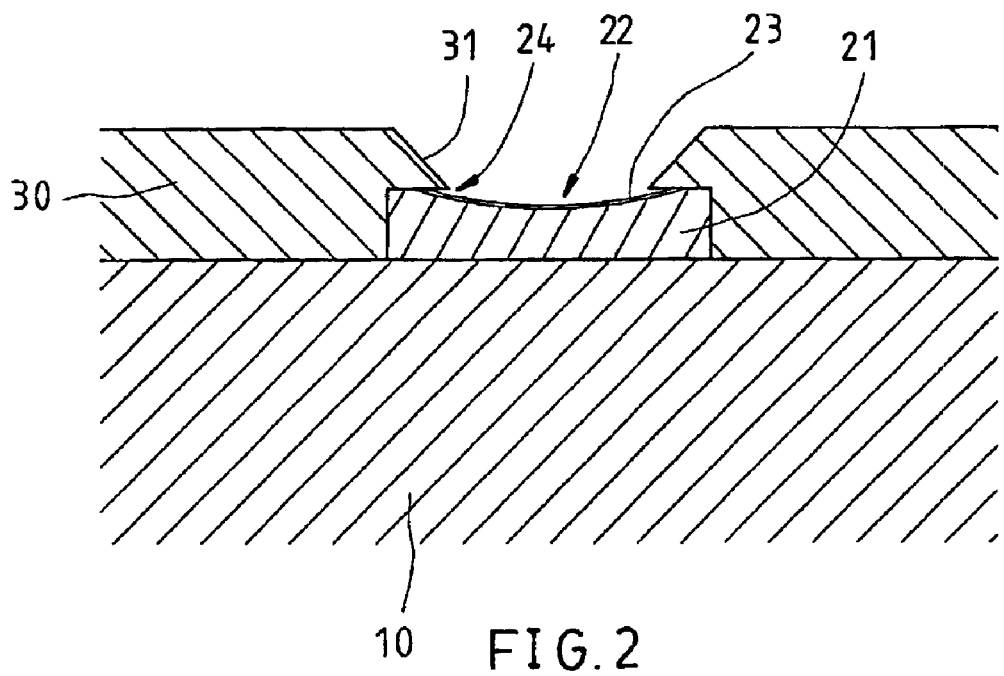
FIG. 2 is a sectional view of a preferred embodiment of the present invention, showing a portion of the printed circuit board.
Figure 3:
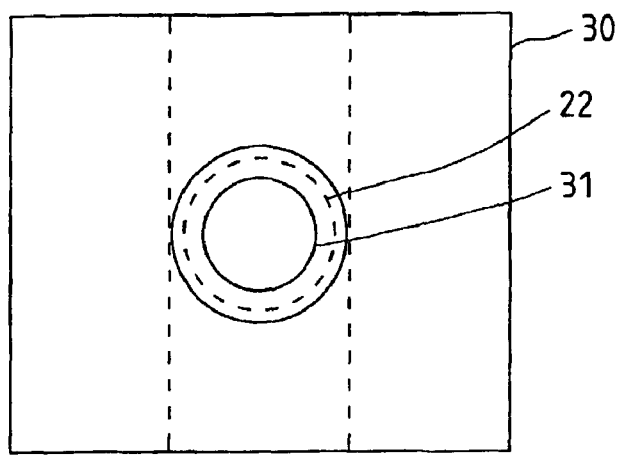
FIG. 3 is a top view of FIG. 2.

Please refer to FIGS. 2 and 3, a printed circuit board provided by a preferred embodiment of the present invention is composed of a substrate 10, bonding pads 20 and a solder mask 30.

The substrate 10 is made of a conventional printed circuit board material, such as FR4 or multi-function epoxy resin, containing a resin. The substrate 10 has a conductive pattern (not shown in the figures) made of copper at a surface thereof and the solder mask 30 coated on the surface and covered over the conductive pattern. The conductive pattern has a plurality of bonding pads 20, and only one of which is shown in the figures for illustration. The solder mask 30 is made of a material containing a resin which is substantially identical to the resin of the substrate and has a plurality of openings 31 (there is only one opening shown in the figures) corresponding in locations to the bonding pads 20 of the conductive pattern. The opening 31 has a dimension small than the bonding pad such that a portion of the bonding pad 20 can be exposed outside.

The bonding pads 20 each has a base 21, a depression 22 formed on the top of base 21 by chemical solution etching, and a plated layer 23 of nickel-gold coated on the depression 22. The dimension of the depression 22, seeing the dot line shown in FIG. 3, is larger than the dimension of the opening 31, such that a space 24 is left in between the margin of the depression 22 and the solder mask 30, and communicated with the opening 31.

Figure 4:
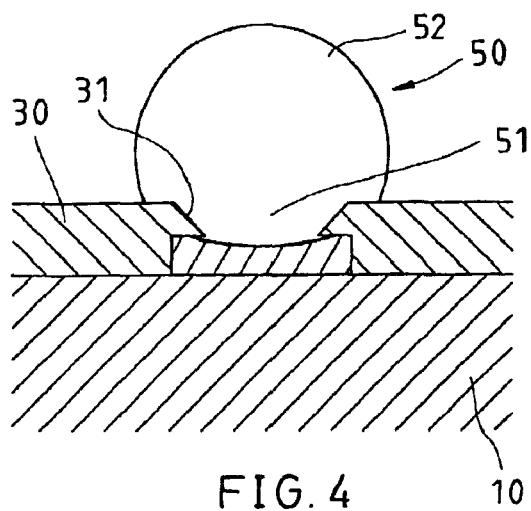
FIG. 4 is a sectional view of the preferred embodiment of the present invention, showing a solder ball is soldered on the bonding pad.
Figure 5:
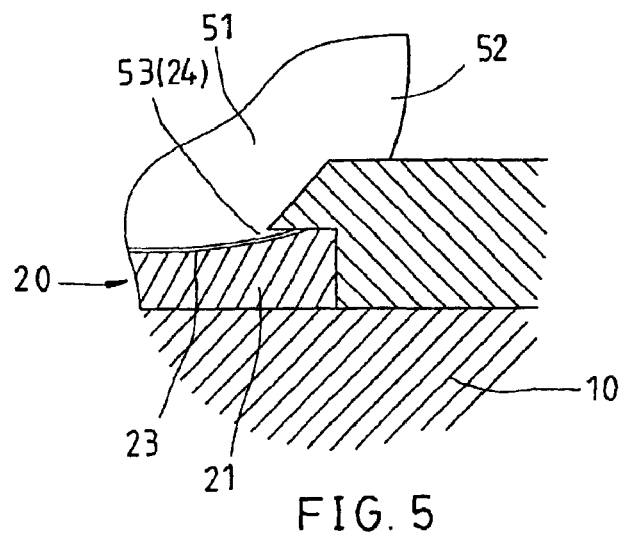
FIG. 5 is an enlarged view of FIG. 4, showing a hook portion of the solder ball received in the space between the bonding pad and the solder mask.

FIGS. 4 and 5 show how solder balls 50, such as solder balls of a Ball Grid Array (BGA), are electrically and mechanically connected to the bonding pads 20 of the substrate 10. At first, the solder balls are attached temporally on the bonding pads of the substrate by means of a layer of flux pre-applied on the bonding pad. Afterwards, the substrate 10 with solder balls attached is treated by a reflow oven which makes the solder balls permanently attach to the bonding pad of the substrate. As shown in FIGS. 4–5, the solder ball 50 undergone the reflowing treatment has a body portion 51, a bump portion 52 and a hook portion 53 as a unit, wherein the body portion 51 is received in the opening 31 of the solder mask 30 having an end thereof soldered on the plated layer 23 of the bonding pad 20, the bump portion 52 is located at the opposite end of the body portion 51 and is extruded out of the opening 31, and the hook portion 53 is laterally extruded from the body portion 51 and is filled in the space 24. Since the hook portion 53 of the solder ball 50 is hooked in the space 24 between the solder mask 30 and the bonding pad 20, it provides a powerful strength for holding the solder ball 50 on the PCB securely such that the solder ball 50 can resist a larger unexpectable force exerted onto it than the prior art.

It is to be understanding for the one skilled in the relative art that the plated layer coated on the base of the bonding pad can be eliminated such that the solder ball is directly soldered on the top of the bonding pad.

What is claimed is:

1. A printed circuit board, comprising:

a substrate;

a conductive pattern disposed on a surface of said substrate and having a bonding pad;

a solder mask coated on the surface of said substrate and covered over the conductive pattern, said solder mask having an opening corresponding in location to said bonding pad such that a portion of said bonding pad is exposed outside;

a space provided between said solder mask and said bonding pad and communicated with the opening, and wherein the bonding pad of said conductive pattern has a depression thereon, said depression having a region located under said solder mask to form said space.

2. The printed circuit board as defined in claim 1, wherein a solder ball is received in said opening of the solder mask and said space and electrically connected to the bonding pad of said conductive pattern.

3. The printed circuit board as defined in claim 2, wherein said solder ball has a body portion received in said opening and having an end thereof electrically connected to the bonding pad of said conductive pattern, a bump portion located at the opposite end of said body portion and extruded out of said opening and a hook portion laterally extruded from said body portion and located in said space.

4. The printed circuit board as defined in claim 1, wherein a plated layer is coated on the bonding pad of the conductive pattern.

5. The printed circuit board as defined in claim 4, wherein a solder ball is received in said opening of said solder mask and said space and electrically connected to said plated layer of said bonding pad.

6. The printed circuit board as defined in claim 5, wherein said solder ball has a body portion received in said opening and having an end thereof electrically connected with said plated layer, a bump portion located at the opposite end of said body portion and extruded out of said opening and a hook portion laterally extruded from said body portion and located in said space.

7. The printed circuit board as defined in claim 1, wherein the bonding pad of said conductive pattern has a depression having a region thereof located under said solder mask to form said space; and wherein a plated layer is coated on the depression of the bonding pad and a solder ball which has a body portion is received in said opening and has an end thereof electrically connected with said plated layer, a bump portion located at the opposite end of said body portion and is extruded out of said opening and a hook portion laterally extruded from said body portion and located in said space.

* * * * *